United States Patent [19]

Kreiter

[11] Patent Number: 4,710,447

[45] Date of Patent: Dec. 1, 1987

[54] COLOR PROOFING AND COLOR PROOFING TRANSFER PROCESS USING WATER DEVELOPED INK

[75] Inventor: Manny Kreiter, Chicago, Ill.

[73] Assignee: Castcraft Industries, Inc., Chicago, Ill.

[21] Appl. No.: 4,857

[22] Filed: Dec. 22, 1986

Related U.S. Application Data

[63] Continuation of Ser. No. 681,929, Dec. 14, 1984, abandoned.

[51] Int. Cl.$^4$ .......................... G03C 7/00; G03C 7/20; G03F 3/06
[52] U.S. Cl. ...................... 430/293; 430/17; 430/256; 430/257; 430/258; 430/275; 430/289; 430/292; 430/294
[58] Field of Search ............... 430/143, 293, 256, 257, 430/258, 292, 294

[56] References Cited

U.S. PATENT DOCUMENTS

| | | | |
|---|---|---|---|
| 2,317,789 | 4/1943 | Marriott | 430/348 |
| 2,558,803 | 7/1951 | Wittgren | 156/240 |
| 2,716,061 | 8/1955 | Lupo | 430/289 |
| 2,742,358 | 4/1956 | Brown | 430/274 |
| 2,819,164 | 1/1958 | Boersma | 430/270 |
| 2,822,280 | 2/1958 | Martin | 430/289 |
| 2,914,404 | 11/1959 | Fanselau et al. | 430/175 |
| 2,956,878 | 10/1960 | Michiels et al. | 430/281 |
| 3,043,683 | 7/1962 | Weyerts et al. | 420/588 |
| 3,131,106 | 4/1964 | Mackenzie | 156/230 |
| 3,168,402 | 4/1965 | Branibar | 430/262 |
| 3,258,337 | 6/1966 | Cousins | 430/293 |
| 3,307,950 | 3/1967 | Appelbaum | 430/263 |
| 3,366,481 | 1/1968 | Lalone | 430/274 |
| 3,607,281 | 9/1971 | Stonham | 430/270 |
| 3,671,240 | 6/1972 | Gramza et al. | 430/271 |
| 3,677,766 | 7/1972 | Tamai et al. | 430/119 |
| 3,681,074 | 8/1972 | Poot | 430/143 |
| 3,682,635 | 8/1972 | van Besauw et al. | 430/145 |
| 3,728,120 | 4/1973 | Hazenbosch et al. | 430/270 |
| 3,741,737 | 6/1973 | Tordjman | 123/527 |
| 4,258,125 | 3/1981 | Edhlund | 430/293 |
| 4,282,310 | 8/1981 | Edhlund | 430/293 |
| 4,286,046 | 8/1981 | Cohen et al. | 430/293 |
| 4,355,095 | 10/1982 | Cousins | 430/293 |
| 4,366,223 | 12/1982 | Larson | 430/293 |
| 4,376,158 | 3/1983 | Spechler | 430/293 |
| 4,376,159 | 3/1983 | Spechler | 430/293 |

FOREIGN PATENT DOCUMENTS 731569  4/1966  Canada .................... 96/39

Primary Examiner—Charles L. Bowers, Jr.
Attorney, Agent, or Firm—Laff, Whitesel, Conte & Saret

[57] ABSTRACT

A method and photo-sensitive ink solution used for producing a tone-accurate color process proof or color transfer is disclosed. The method includes multiple applications of sequential layers of extender coat powder and photo-sensitive ink solution coats. These layers are individually exposed to actinic light through a design bearing film, and that material not underlying the exposed ink coat is removed by means of a light water spray before a new series of sequential layers are applied.

9 Claims, No Drawings

4,710,447

COLOR PROOFING AND COLOR PROOFING TRANSFER PROCESS USING WATER DEVELOPED INK

This application is a continuation of application Ser. No. 06/681,929, filed Dec. 14, 1984, now abandoned.

BACKGROUND

1. Field of the Invention

The present invention relates generally to a novel method of producing a color proof of an image to be ultimately printed on a support surface. More particularly, it relates to a method of producing a tone-accurate color proof, process proof or color transfer of an image including a developing step comprising the removal of unexposed ink material by means of a water spray.

2. Brief Description of the Background Art

Presently, color proofs are produced on the surfaces of items such as paper, silicates, metals, acrylic polymers and other substrate materials by complicated procedures. These prior art procedures typically utilize hazardous chemicals for several steps and often require difficult-to-learn or impossible-to-teach techniques. These techniques are generally such that require "the proper touch" or "experience" to achieve a level of perfection or even moderate success. This is in part due typically to the poor adhesion of the color proofing composition to the support sheet.

In a typical color proof production procedure, the support sheet is homogeneously coated with a proofing composition. In practice this composition may be either a solution or a mixture. The composition may contain casein, a primary color pigment and a light sensitive agent. When casein compositions are used, only one certain substrate can be used. The light sensitive agent used, typically a dichromate, is a chemical which drastically changes its solubility upon exposure to actinic light. The composition is dried, usually by evaporating its carrier. Selective transmission of the actinic light is provided by placing an image-bearing negative over the support sheet. The appropriate actinic light source is then energized for a time sufficient to convert and harden the dichromate only in the areas exposed to the light source.

The support sheet is then wetted with the aforementioned composition carrier, with which the converted dichromate previously exposed to the actinic light source is now substantially insoluble. The support sheet is scrubbed and the unexposed composition, which retains its initial solubility with the carrier, is removed thereby. The result of this step is the production of a one color proof of the image on the negative. As most end-uses require four color process proofs, this process is simply repeated three more times, each repetition utilizing different appropriately colored pigments.

Color proofs produced in this manner are extremely useful for final evaluation of print formats before a production run. Properly done, they give precise indication of color break-up and registration. These proofs should contain no optical aberrations. However, a significant drawback is present in existing water developed systems in that the color fidelity of the finished and intermediate proofs is not always desireable, and further, not of a standard considered even minimally reliable. Further, as these proofs are delicate and easily abraded, they require care not commonly found in a business environment. It is obvious that a heretofore unavailable chromatically correct water developed color proof would be a great asset to the printing and graphic industries. Similary, it would be useful to develop a more sturdy or durable proof that is not so often damaged, is less expensive to produce and easy to use.

SUMMARY OF THE INVENTION

It is the specific object of this invention to provide a four color process proofing system yielding finished tone-accurate proofs intended to reproduce color fidelity.

It is another object of this invention to provide a color process proofing system capable of yielding a color transfer.

In a broad embodiment therefore, these objects and others are provided by an improved proofing system. Utilizing the presently disclosed system, a desired image is created on a suitable support comprising a broad range of substrates by photo projection or contact application of actinic light through a negative comprising the desired image. The actinic light activates a photo reactive ink dispersed on the support sheet, whereby the unexposed portion of the ink is removed by spraying water over the unexposed ink. This ink yields a proof that is designed to adhere to the support substantially better than prior art inks, and further, results in a desireably pure process color. In the presently disclosed invention, the need to scrub away unexposed portions of ink is eliminated.

DETAILED DESCRIPTION OF THE INVENTION

The procedure of the presently disclosed invention comprises initially preparing a multi-layered assembly of materials which are sequentially exposed to actinic light under a negative comprising the image or illustration of the design or graphic to be duplicated. To start the procedure, a desired support sheet is selected. In the present invention, it has been discovered that substrates such as plastic, glass, metals, woods, artboard compositions and the like form desirable bases for the disclosed process. Although the process requires a non-porous support sheet substrate, if only a porous substrate is desireable or obtainable, it may be utilized. If a porous sheet is so selected, it must be made non-porous by coating or saturating the sheet with a gel. A lacquer finish must then be applied to the gel surface. The selected support sheet is placed upon a receiving bed, which functions to hold it in place and preclude accidental displacement of the sheet.

A coat of sealer material, such as varnish by way of example, is then applied to the top surface of the selected sheet, and allowed to dry. The sealer layer creates a coat that is compatible with a powder coat which is applied next, and which ultimately prevents the colored inks from being unintentionally absorbed into the support sheet substrate. The powder coat is preferably a highly pulverized preparation containing a matting agent such as silicium dioxide. The powder layer applied over the sealer is used to give the design a matte finish. This dulls the sealer finish and makes the ink layer more adherent to the sealer layer to which it is applied by allowing the ink layer to better adhere to the powder layer.

The ink layer is then applied over the powder. The ink used in the present invention contains a photo emulsion sensitizer solution mixed in with the ink to make the ink compound harden in areas exposed to actinic light. The unexposed portion remains soft enough to be removed from the substrate by using a fine spray of water under light pressure. The ink is manufactured pursuant to the following formula:

|  | Range, by wgt. |
| --- | --- |
| polyvinyl alcohol | 6.2–30.8% |
| phenol | 0.4–0.9% |
| Petrowet | 0.2–0.4% |
| Merpol 05 | 0.2–0.4% |
| Aerosol O.T. 75% | 3.5–7.0% |
| sodium dichromate | 0.9–3.5% |
| pigments | 4.4–22% |
| deionized water | balance |

Petrowet is a commercial designation for a sodium alkyl sulfonate product. Merpol 05 is a commercial designation for a fatty alcohol/ethylene oxide condensate. Aerosol O. T. 75% is a dioctyl sodium sulfosuccinate compound. Each of Petrowet, Merpol 05 and Aerosol O. T. 75% act as wetting agents in the present invention, ensuring that the ink carrier, and therefore the ink, is easily spread to form an even, continuous film. The ink formula set forth above provides a solution that is miscible with the pigments used in the system, whereby the continuity of the ink layer provides that the ultimate color will not unintentionally vary from spot to spot. Applied in liquid form, the ink formula of the present invention has properties to enhance the adherence of the pigment and photo-sensitizer to the lacquer coat. The uniformity of the ink film is further enhanced by spreading the ink layer using a fine wire wound coating rod. The wire ranges from 0.001 inches to 0.012 inches in thickness. To alter the intensity of any color of the finished image, various thicknesses of wire can be used to draw the ink over the support sheet. It has been discovered that by utilizing a thinner wire, the intensity of the color diminishes, lessening the vibrancy of the color. Conversely, by using a thicker wire, the color intensity is increased, thereby enhancing the vibrancy of the color. This is an important feature of the present invention, since it allows an art director, or the ultimate user of the process, to specify a change in color fidelity of the finished printed piece, which change can readily be made by inexpensively repeating the process by merely using coating rods of varying wire thicknesses to achieve the desired color fidelity. Drawing the ink film with a wire wound rod provides for reproduceable film depths, such that the ultimate color will not substantially vary from proof to proof. At this stage, the ink film is allowed to dry.

Prior to allowing the ink to dry, the operator of the process has the ability to correct the application of any color which is found to be incorrect, even during the progress of the process. For example, after two colors of a four color procedure have been applied, and the third ink has been applied, the operator may decide that the third color is too intense, or not intense enough, whereby it is desired to change the third color while not disturbing the previously applied colors. Under these circumstances, the operator, after applying the third color ink with a wire wound rod, and before exposure, merely removes the ink, which remains soft, with water, and re-applies the third color with another rod having a different thickness of wire wound around the rod. The color intensity is then checked, and if necessary, can be removed again and re-applied with yet another wire wound rod without disturbing the underlying, previously applied colors.

After the above described assembly of layers of materials has been prepared, the entire assembly, ink layer side up, is then exposed to actinic light through an image-bearing negative, emulsion side down, to provide good contact between the emulsion in the ink and the emulsion on the negative. This hardens the photo reactive ink in the area exposed to the light. The remaining unexposed ink remains soft. The negative, of course, contains the colored design to be ultimately formed on the support sheet. Following exposure, the actinic light source is shut off and the negative removed. The assembly of materials is then washed down with a water spray under light water pressure, whereby the portion of the ink which did not harden is washed away. Only the image exposed to the light remains. Unlike prior art color proofs, the present invention requires no abrasives or manual pressure to remove the undeveloped ink. This is also unlike the disclosure of U.S. Pat. No. 2,716,061 to Lupo. Lupo uses a washing step, with harmful abrasives or manual pressure, and is only operative on a support sheet produced from a specific substrate. Additionally, Lupo further is only operative with casein, which is bacteriostatic and yields an ink having a greatly foreshortened shelf life. This is unlike the ink of the present invention which has a relatively long shelf life.

Any water remaining on the assembly of layers is now removed such as by blow drying, and a layer of powder is applied, as detailed above. An alternative preferred embodiment provides for the application of a coat of varnish before each new layer of extender powder is applied. This varnish coat would add extra protection for the immediately preceeding ink layer. After the extender powder coat is laid down, another ink coat is applied as before. The entire process is repeated, in total, four times to create a four color process proof. It has been discovered that the process can be repeated to apply as many colors as desired.

After the complete application of the four colors, the completed proof is removed from its bed. This procedure is less expensive than prior art color proof procedures, can proof up to a 200 line screen, eliminates the need for expensive machinery, equipment or developers and will consistently copy screen images dot for dot. Additionally, only minor modifications to the procedure allow the production of single or multi-colored color transfer proofs.

To produce a color tranfer proof, the support sheet required is a polystyrene substrate. A release coat is first applied to the support sheet. The release coat is a common propylene based varnish containing a conventional release agent. The release coat is allowed to dry.

As before, sequential layers of powder and ink compound must be applied to produce a multi-color transfer proof. However, when making a transfer proof the negative used for selectively admitting the actinic light must be a reversal of that used previously to make the direct proof. The additional steps are identical as to those taught earlier, save that after the final color is developed, the unexposed release coat is removed by ink developer, and a pressure sensitive adhesive is applied as the final coat. The adhesive is selected such that the color image shears off cleanly from the support sheet, leaving no residue around or about the edges of the image. The finished transfer is now ready to be transferred to any receiving object or substrate, regardless of contour.

It should be understood that various modifications can be made to the preferred embodiments disclosed herein without departing from the spirit and scope of the invention or without the loss of its attendant advantages. Thus, other examples applying the principles described herein are intended to fall within the scope of the invention provided the features stated in any of the following claims or the equivalent of such be employed.

I claim:

1. A tone-accurate color process proof comprising a substrate coated with a photo-sensitive water soluble ink solution that has been exposed to actinic light through an image-bearing negative, said photo-sensitive ink being such that only the unexposed portion thereof is water removeable from said substrate by means of a water spray; said method comprising the steps of:
    (a) applying a first sealer coat over said substrate to prevent ink from being unintentionally absorbed into the substrate;
    (b) drying said first sealer coat;
    (c) applying next a layer of powdered material as a matting agent;
    (d) applying a photo-sensitive water soluble ink layer over said layer of powdered material;
    (e) spreading said ink layer over said powdered layer;
    (f) drying said ink layer;
    (g) exposing the foregoing layers of materials to actinic light through an image-bearing film comprising the design to be formed on said substrate, whereby said photosensitive ink material hardens only where exposed to said actinic light;
    (h) removing the unexposed photo-sensitive ink layer and powder only in the areas of said unexposed photo-sensitive ink layer by means of a light water spray;
    (i) drying said water spray; and
    (j) repeating steps (c)–(i) for each additional color coat desired to be applied to said substrate.

2. The method of producing a tone-accurate color process proof of claim 1 including the additional step of:
    (a) applying a varnish coat over the remaining photo-exposed photo-sensitive ink layer subsequent to the step of drying said water spray.

3. The method of producing a tone-accurate color process proof of claim 1 wherein the substrate is a porous substrate, said method further including, prior to the step of applying a first sealer coat over said porous substrate, the additional steps of:
    (a) applying a waterproofing gel layer to said porous substrate;
    (b) drying said gel layer;
    (c) applying a clear lacquer coat to said gel layer; and
    (d) drying said lacquer coat.

4. The method of producing a tone-accurate color process proof of claim 1 wherein said substrate comprises a polyethylene terephthelate.

5. The method of producing the tone-accurate color process proof of claim 1 wherein said spreading step (e) utilizes spreading means comprising a wire wound spreading rod, said wire being wrapped therearound said rod, said wire having a constant diameter, said diameter ranging between 0.001 inches and 0.012 inches, inclusive.

6. The method of producing a tone-accurate color process proof of claim 1 wherein said powdered layer includes a matting agent.

7. The method of producing a tone-accurate color process proof of claim 6 wherein said matting agent comprises silicium dioxide.

8. A method of producing a tone-accurate color transfer comprising a non-porous substrate coated with a photo-sensitive water soluble ink over varnish material containing a release agent; said ink being exposed to actinic light through an image-bearing negative, said photo-sensitive ink being such that only the unexposed portion thereof is water removeable from said substrate by means of a water spray, said method comprising the steps of:
    (a) applying a varnish coat containing a release agent over said substrate;
    (b) drying said release coat;
    (c) applying a layer of powdered material over said release coat;
    (d) applying a water soluble photo-sensitive ink compound layer over said powdered layer;
    (e) spreading said ink layer over said powdered layer;
    (f) drying said ink layer;
    (g) exposing the foregoing layers of materials to actinic light through a reversal image bearing film comprising the design to be formed on said substrate, whereby said photo-sensitive ink solution material hardens only where exposed to said actinic light;
    (h) removing the unexposed photo-sensitive ink solution layer and powder only in the areas of said unexposed photo-sensitive ink layer by means of a light water spray;
    (i) drying said water spray;
    (j) repeating steps (c)–(i) for each additional color coat desired to be applied to said substrate;
    (k) removing unexposed release coat with developer; and
    (l) applying a pressure sensitive adhesive material over said layers of materials as a final coat.

9. The method of producing the tone-accurate color process proof of claim 8 wherein said spreading step (e) utilizes spreading means comprising a wire wound spreading rod, said wire being wrapped therearound said rod, said wire having a constant diameter, said diameter ranging between 0.001 inches and 0.012 inches, inclusive.

* * * * *